United States Patent
Leussler et al.

(10) Patent No.: US 10,877,114 B2
(45) Date of Patent: Dec. 29, 2020

(54) CO-PLANAR RF COIL FEEDING

(71) Applicant: KONINKLIJKE PHILIPS N.V., Eindhoven (NL)

(72) Inventors: Christoph Leussler, Hamburg (DE); Ingo Schmale, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 75 days.

(21) Appl. No.: 16/340,396

(22) PCT Filed: Oct. 9, 2017

(86) PCT No.: PCT/EP2017/075672
§ 371 (c)(1),
(2) Date: Apr. 9, 2019

(87) PCT Pub. No.: WO2018/069247
PCT Pub. Date: Apr. 19, 2018

(65) Prior Publication Data
US 2019/0227133 A1      Jul. 25, 2019

(30) Foreign Application Priority Data

Oct. 10, 2016  (EP) .................................... 16193034
Nov. 28, 2016  (EP) .................................... 16200907

(51) Int. Cl.
*G01R 33/34* (2006.01)
*G01R 33/36* (2006.01)
*G01R 33/422* (2006.01)

(52) U.S. Cl.
CPC . *G01R 33/34007* (2013.01); *G01R 33/34076* (2013.01); *G01R 33/36* (2013.01); *G01R 33/422* (2013.01)

(58) Field of Classification Search
CPC ........ G01R 33/34007; G01R 33/34076; G01R 33/36; G01R 33/422
See application file for complete search history.

(56) References Cited

U.S. PATENT DOCUMENTS 6,175,237 B1    1/2001   Doty et al.
6,535,084 B1    3/2003   Tropp
(Continued)

OTHER PUBLICATIONS

Zhang et al., An Inverted-Microstrip Resonator for Human Head Proton MR Imaging at 7 Tesla, IEEE Transactions on Biomedical Engineering, vol. 52, No. 3, Mar. 2005 (Year: 2005).*

*Primary Examiner* — Daniel R Miller

(57) ABSTRACT

The present invention provides a radio frequency (RF) coil (140) for use in a magnetic resonance (MR) imaging system (110), whereby the RF coil (140) comprises a coil PCB (200), multiple conductive elements (202) provided on the coil PCB (200), multiple feeding ports (210) for the excitation of the multiple conductive elements (202), at least one connection port (212), and multiple feeding lines (214) connecting the at least one connection port (212) to the multiple feeding ports (210), whereby the multiple feeding lines (214) are provided as co-planar feeding lines, which are arranged at the coil PCB (200). The present invention further provides a radio frequency (RF) arrangement (142), comprising a RF coil (140) as specified above and a RF shield (124). The present invention also provides a MR imaging system (110) comprising the above RF coil (140) of the above RF arrangement (142).

14 Claims, 6 Drawing Sheets

(56) References Cited

U.S. PATENT DOCUMENTS

| | | |
|---|---|---|
| 8,497,682 B2 | 7/2013 | Huish et al. |
| 2005/0062472 A1 | 3/2005 | Bottomley |
| 2008/0272786 A1 | 11/2008 | Luedeke et al. |
| 2008/0284435 A1 | 11/2008 | Overweg et al. |
| 2009/0243611 A1 | 10/2009 | Holle et al. |
| 2010/0090699 A1 | 4/2010 | Haans et al. |
| 2010/0117652 A1 | 5/2010 | Cork |
| 2012/0081119 A1 | 4/2012 | Murphree et al. |
| 2012/0182015 A1 | 7/2012 | Driemel et al. |
| 2013/0063147 A1* | 3/2013 | Findeklee ............ G01R 33/365 324/309 |
| 2013/0293232 A1 | 11/2013 | Boskamp et al. |
| 2014/0218032 A1 | 8/2014 | Mohebbi et al. |
| 2017/0299671 A1 | 10/2017 | Holle |

\* cited by examiner

CO-PLANAR RF COIL FEEDING

CROSS REFERENCE TO RELATED APPLICATIONS

This application is a U.S. national phase application of International Application No. PCT/EP2017/075672 filed on Oct. 9, 2017, which claims the benefit of EP Application Serial No. 16193034.2 filed on Oct. 10, 2016 and EP Application Serial No. 16200907.0 filed Nov. 28, 2016, both of which are incorporated herein by reference.

FIELD OF THE INVENTION

The invention relates to the field of radio frequency (RF) coils for use in a magnetic resonance (MR) imaging system, a RF arrangement for use in a MR imaging system (110), comprising a RF coil and a RF shield, a MR imaging system employing at least one such RF coil, and a MR imaging system employing at least one such RF arrangement.

BACKGROUND OF THE INVENTION

In state of the Art MRI-systems, a subject of interest, typically a patient, to be imaged is located somewhere within the free open space near or at the center of a body coil. The body coil can be provided as a birdcage coil with a coil PCB (printed circuit board). The coil PCB has an inner metallization layer, which provides rungs and rings as well as capacitors. The RF coil is typically shielded by a RF shield. The RF shield comprises a shield PCB. The shield PCB has an inner metallization layer with a shielding structure formed therein. The RF shield coaxially encompasses the RF coil. The coil PCB and the shield PCB are non-conductive, and the respective metallization layers are typically made from copper.

The RF shield and the RF coil can be provided together as a RF arrangement. In the RF arrangement, the RF coils and the RF shield are typically provided as a single component.

State of the Art RF coils comprise two- or even multi-channel body coils, which use two or more geometrically decoupled feeding ports of a birdcage for RF-shimming. This technique strongly increases the field homogeneity and enables clinical imaging for additional applications at high fields. Most common are two-port RF coils.

In order to provide power from an external amplifier to the feeding port, the RF coil is typically connected to the amplifier from one side of the RF coil. One feeding port can be directly connected, whereas the other feeding port is connected via a coaxial cable. However, coaxial cables provided on rungs reduce and distort the B1 field. Furthermore, the unilateral feeding may lead to an axially asymmetric distribution of electrical field E and thus increased SAR.

The axially asymmetric distribution of the electrical field E can at least be partly overcome using four or eight port feeding with fixed phase and amplitude. This feeding requires the routing of several coaxial cables over the whole length of the RF coil, thus potentially increasing local field inhomogeneity. In addition, the feeding lines are incompatible with MRI LINAC.

The coaxial cables are typically located within the space between the RF coil and the shield. Typically, the coaxial cables are attached to the shield PCB by solder or glue. The coaxial line is made up by an inner conductor, an isolating material, and an outer conductor. By soldering, the outer conductor of the coaxial line gets electric potential identical to the metal on the shield PCB. In principle, the coaxial cables can also be attached to the coil PCB.

In this context, document US 2014/0218032 A1 refers to a resonator device for spin resonance applications. The resonator device includes a substrate, terminals, and resonators. The terminals include a first terminal having first terminal segments disposed on a substrate surface, and a second terminal having second terminal segments disposed on the substrate surface opposite the first terminal segments. The resonators include conductors disposed on the substrate surface between the first and second terminals. Each conductor is disposed between one of the first terminal segments and a respective, opposite one of the second terminal segments.

Document U.S. Pat. No. 6,175,237 B1 discloses that two halves of a conventional RF saddle coil, such as spirals or other related structures for use in high resolution NMR or MRI, are disposed on opposite sides of a cylindrical coil-form, and rotated from the conventional orientation 90 degrees about the B1 axis, so that the leads are paralleled near the axial center of the RF coil.

Furthermore, document US 2012/0081119 A1 refers to a probe for an NMR device, in which a saddle coil is disposed on one side of a flexible insulating material, and an additional conductor is disposed on the opposite side. The additional conductor and the conductors of the saddle coil create a capacitance across the insulating material. This capacitance acts with the inductance of the saddle coil such that the probe itself forms a transmission line. The probe is thus inherently broadband and requires no tuning. It also presents a constant impedance, thus facilitating impedance matching to an NMR spectrometer. In a preferred embodiment, a chip resistor is disposed on the flexible insulating material, terminating the transmission line.

Still further, document WO 2005/052621 A1 refers to a magnetic resonance imaging system including main magnet that produces a substantially spatially and temporally constant main magnetic field within a field of view. Magnetic field gradient coils impose selected magnetic field gradients on the main magnetic field within the field of view. At least one radio frequency coil is arranged to detect a magnetic resonance signal induced by an applied radio frequency pulse. The at least one radio frequency coil includes a radio frequency antenna and electronics module disposed on a substrate. The electronics are electrically connected with the radio frequency antenna. The electronics are mounted in a centered region surrounded by the radio frequency antenna.

SUMMARY OF THE INVENTION

It is an object of the invention to provide a radio frequency (RF) coil for use in a magnetic resonance (MR) imaging system, a RF arrangement for use in a MR imaging system (110), comprising a RF coil and a RF shield, a MR imaging system employing at least one such RF coil, and a MR imaging system employing at least one such RF arrangement, which reduces problems of coaxial cables used in RF coils and RF arrangements. In particular, it is an object of the present invention to enable generation of a B1-field with reduced inhomogeneities and with an increased compatibility for use with MRI LINAC.

This object is achieved by a radio frequency (RF) coil for use in a magnetic resonance (MR) imaging system, whereby the RF coil comprises a coil PCB, one or multiple conductive elements provided on the coil PCB for applying a RF magnetic field to an examination space during RF transmit phases to excite nuclei of a subject of interest, and to receive MR signals from the excited nuclei during RF receive phases, one or multiple feeding ports for the excitation of the multiple conductive elements, at least one connection port, and one or multiple feeding lines connecting the at least one connection port to the one or multiple feeding ports, whereby the one or multiple feeding lines are provided as co-planar feeding lines, which are arranged at the coil PCB, whereby the co-planar feeding lines are suitable to convey microwave-frequency signals and comprise a conducting track, which is printed onto a dielectric substrate, together with a pair of return conductors, which are provided one to either side of the conducting track, and all three conductors are provided co-planar on the same side of the substrate.

This object is further achieved by a radio frequency (RF) arrangement for use in a magnetic resonance (MR) imaging system, comprising a RF coil according to any preceding claim and a RF shield, whereby the RF shield coaxially encompasses the RF coil, the RF shield comprising a shield PCB, and a metallic shield structure provided at the shield PCB, and multiple connection lines connected to the at least one connection port, whereby the multiple connection lines are provided as co-planar connection lines, which are arranged at the shield PCB, and at least one radial connection element, which extends between the shield PCB and the coil PCB, and which electrically connects the multiple connection lines to the coil PCB for connection to the at least one connection port.

This object is also achieved by a magnetic resonance (MR) imaging system, comprising a tubular examination space provided to position a subject of interest therein, at least one radio frequency (RF) coil as specified above, a RF screen for shielding the examination space, a magnetic gradient coil system for generating gradient magnetic fields superimposed to the static magnetic field, and a main magnet for generating a static magnetic field, whereby the RF coil, the RF screen, the magnetic gradient coil system, and the main magnet are positioned in this order in a direction radially outward around the examination space.

This object is still further achieved by a magnetic resonance (MR) imaging system, comprising a tubular examination space provided to position a subject of interest therein, a magnetic gradient coil system for generating gradient magnetic fields superimposed to the static magnetic field, a main magnet for generating a static magnetic field, and at least one radio frequency (RF) arrangement as specified above, whereby the RF arrangement, the magnetic gradient coil system, and the main magnet are positioned in this order in a direction radially outward around the examination space.

In other words, the object is solved in the present invention by providing the feeding lines as co-planar feeding lines. This allows having a coil structure of the RF coil and the feeding lines on one single PCB, i.e. no additional coaxial cables need to be added in an extra manual production step. Thus production time and cost of integration are reduced.

Co-planar feeding lines refer to a type of electrical transmission line, which can be fabricated using printed circuit board technology, and is suitable to convey microwave-frequency signals. Co-planar feeding lines comprise a conducting track, which is printed onto a dielectric substrate, together with a pair of return conductors, which are provided one to either side of the conducting track. All three conductors are on the same side of the substrate, and hence are co-planar. The return conductors are separated from the central track by a small gap, which has an unvarying width along the length of the line.

Preferably, the RF coil is a system integrated body coil with four or eight port feeding using PCB integrated co-planar RF power feeding lines. The RF coil comprises rings and rungs as conductive elements. Further preferred, feeding port and conductive elements are integrated on one PCB, so that a separate coaxial cable for feeding can be omitted. A coil PCB former can be connected in one process in production without additional routing and soldering of the feeding coax cable, thus saving time and production costs. Coax cables also have a reduced reliability due to the solder process used in the manufacturing process of the RF coil. Furthermore, the integrated feeding design of the RF coil provides better radiation transparency compared with coax feeding for LINAC MRI scanner. Hence, this RF coil architecture is useful for image guided therapy using MRI in combination with proton/LINAC therapy, as no solid coax cable parts are present in the proton/LINAC beam.

In the RF arrangement, the radial connection element interconnects the connection lines to the coil PCB. However, it is not required that the radial connection element has a strict radial extension between the coil PCB and the shield PCB. Furthermore, the connection lines can be directly or indirectly connected to the connection port. Hence, the at least one radial connection element may be directly connected to the connection port of the RF coil, or via further connection of feeding lines provided on the coil PCB.

The present and further discussion of the details of the connection lines and the feeding lines are generally applicable to the connection lines and the feeding lines. Furthermore, and more general, the teachings in respect to the RF coil and the RF shield can be applied vice versa. This includes also the radial connection element. According to a preferred embodiment, the co-planar feeding lines are provided as metallization on the coil PCB. With the co-planar feeding lines provided directly on the coil PCB, manufacturing of the RF coil can be facilitated, since no additional PCB is required. Furthermore, the rungs and the feeding lines can be provided in essentially a single production process.

According to a preferred embodiment, the co-planar feeding lines are provided as conductor-backed co-planar waveguide (CBCPW) with a ground plane covering an area corresponding at least to an area covered by conductors of the co-planar feeding lines. The conductor-backed co-planar waveguide is a variant of the co-planar waveguide, which has a ground plane covering the entire back-face of the substrate. The ground-plane serves as a third return conductor. Also the conductor-backed co-planar waveguide can be easily manufactured on the coil PCB. However, a separate feeding line PCB is required between the ground plane and the conductors. This has the advantage that a suitable material can be chosen in accordance with requirements of the feeding line. Limitations based on the use of a certain type of PCB, which is e.g. suitable for the RF coil or the RF shield, can be overcome. The conductor-backed co-planar waveguide can be provided on the coil PCB or the shield PCB with its ground plane oriented towards the respective PCB, or vice versa.

According to a preferred embodiment, the coil PCB is provided with at least one slot, at least one feeding line PCB is provided in the at least one slot, and at least one feeding line is provided on the at least one feeding line PCB. Hence, the feeding line performance can be controlled by free choice of the material of the feeding line PCB without the need to provide the feeding line PCB on top of the coil PCB. Hence, the RF coil can be provided with an essentially uniform outer surface without elevations. The same principles can be applied to the design of the connection lines on the shield PCB.

According to a preferred embodiment, at least one of the co-planar feeding lines has an axial section extending in a longitudinal direction of the RF coil. Hence, when the connection port is provided laterally at the RF coil, the axial section can extend over essentially the entire length of the RF coil to connect feeding ports at an opposite end of the RF coil. When the RF coil has a central feeding port, axial sections can extend to either end of the RF coil to connect respective feeding ports. The circumferential section typically does not reduce field homogeneity.

According to a preferred embodiment, at least one of the co-planar feeding lines has a circumferential section extending in a circumferential direction of the RF coil, whereby the circumferential section is provided in a center region with respect to a longitudinal direction of the RF coil. The circumferential section can possibly affect field homogeneity. However, when being provided in the center region, these effects are very small.

According to a preferred embodiment, at least one of the co-planar feeding lines has an outer section extending on an outer side of the coil PCB, and an inner section extending on an inner side of the coil PCB, whereby the coil PCB is provided with at least a coil contact element extending radially through the coil PCB, which electrically connects the outer section and the inner section. With the coil contact element, a high level of freedom for design of the RF coil is provided, since the feeding lines can be provided as most suitable on either side of the coil PCB.

According to a preferred embodiment, the at least one radial connection element is provided in a center region of the RF coil with respect to a longitudinal direction of the RF coil. When being provided in the center region, effects of the radial connection element on field homogeneity are typically small.

According to a preferred embodiment, the at least one radial connection element comprises a connection PCB with a connection metallization provided thereon, whereby the connection metallization connects the multiple connection lines to the coil PCB.

According to a preferred embodiment, the connection PCB is provided as a flexible PCB. The flexible PCB facilitates design and manufacturing of the RF assembly.

According to a preferred embodiment, the multiple connection lines are provided at a radially outer face of the shield PCB, the shield PCB has at least one hole, and the at least one radial connection element extends through the at least one hole from the shield PCB to the coil PCB. Hence, either side of the shield PCB can be easily connected using the radial connection element. The hole is preferably provided in a central region of the RF coil or the RF assembly.

According to a preferred embodiment, the multiple feeding lines are provided at a radially inner face of the coil PCB, the coil PCB has at least one hole, and the at least one radial connection element extends through the at least one hole from the shield PCB to the coil PCB. Hence, either side of the coil PCB can be easily connected using the radial connection element. The hole is preferably provided in a central region of the RF coil or the RF assembly.

According to a preferred embodiment, at least one of the connection lines has an outer section extending on an outer side of the shield PCB, and an inner section extending on an inner side of the shield PCB, whereby the shield PCB is provided with at least a shield contact element extending radially through the shield PCB, which electrically connects the outer section and the inner section. With the shield contact element, a high level of freedom for design of the RF shield and the RF arrangement is provided, since the connection lines can be provided as most suitable on either side of the shield PCB.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
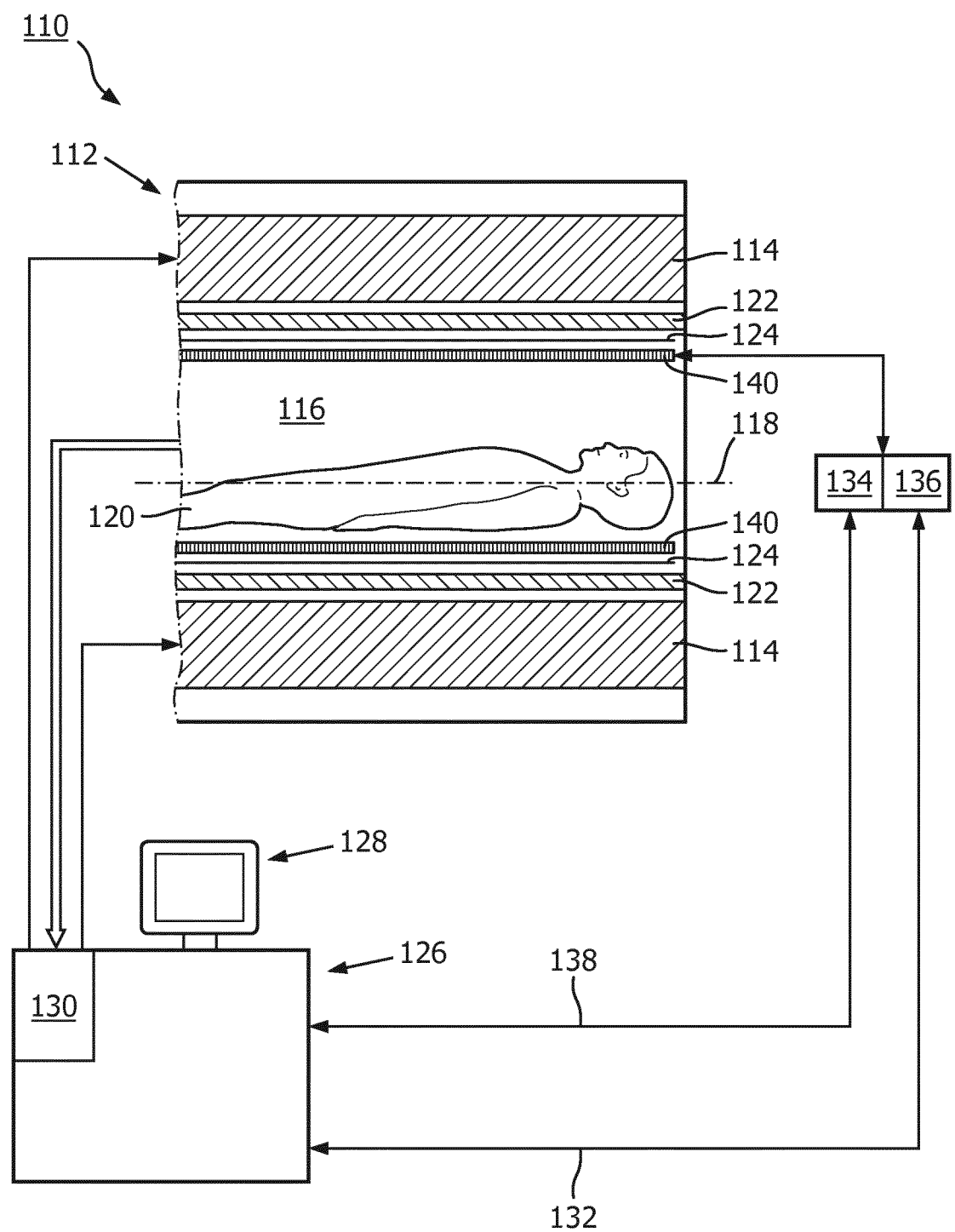
FIG. 1 is a schematic illustration of a part of a generic embodiment of a magnetic resonance (MR) imaging system.

FIG. 1 shows a schematic illustration of a part of an embodiment of a magnetic resonance (MR) imaging system 110 comprising an MR scanner 112. The MR imaging system 110 is described here generically as a basis for all further embodiments.

The MR imaging system 110 includes a main magnet 114 provided for generating a static magnetic field. The main magnet 114 has a central bore that provides an examination space 116 around a center axis 118 for a subject of interest 120, usually a patient, to be positioned within. In this embodiment, the central bore and therefore the static magnetic field of the main magnet 114 have a horizontal orientation in accordance with the center axis 118. In an alternative embodiment, the orientation of the main magnet 114 can be different, e.g. to provide the static magnetic field with a vertical orientation. Further, the MR imaging system 110 comprises a magnetic gradient coil system 122 provided for generating gradient magnetic fields superimposed to the static magnetic field. The magnetic gradient coil system 122 is concentrically arranged within the bore of the main magnet 114, as known in the art.

Further, the MR imaging system 110 includes a radio frequency (RF) coil 140 designed as a whole-body coil having a tubular body. In an alternative embodiment, the RF coil 140 is designed as a head coil or any other suitable coil type for use in MR imaging systems 110. The RF coil 140 is provided for applying a RF magnetic field to the examination space 116 during RF transmit phases to excite nuclei of the subject of interest 120, which shall be covered by MR images. The RF coil 140 is also provided to receive MR signals from the excited nuclei during RF receive phases. In a state of operation of the MR imaging system 110, RF transmit phases and RF receive phases are taking place in a consecutive manner. The RF coil 140 is arranged concentrically within the bore of the main magnet 114. As is known in the art, a cylindrical RF shield 124 is arranged concentrically between the magnetic gradient coil system 122 and the RF coil 140. Hence, the RF shield 124 coaxially encompasses the RF coil 140. In some embodiments, the RF coil 140 and the RF shield 124 are provided integrally, thereby forming a radio frequency (RF) arrangement 142.

In this context, it is to be noted that the RF coil 140 has been described as transmit and receive coil. Nevertheless, the RF coil 140 can also be provided as transmit or receive coil only.

Moreover, the MR imaging system 110 comprises an MR image reconstruction unit 130 provided for reconstructing MR images from the acquired MR signals and an MR imaging system control unit 126 with a monitor unit 128 provided to control functions of the MR scanner 112, as is commonly known in the art. Control lines 138 are installed between the MR imaging system control unit 126 and a RF transmitter unit 134 that is provided to feed RF power of an MR radio frequency to the RF coil 140 via a RF switching unit 136 during the RF transmit phases. The RF switching unit 136 in turn is also controlled by the MR imaging system control unit 126, and another control line 132 is installed between the MR imaging system control unit 126 and the RF switching unit 136 to serve that purpose. During RF receive phase, the RF switching unit 136 directs the MR signals from the RF coil 140 to the MR image reconstruction unit 130 after pre-amplification.

Figure 2:
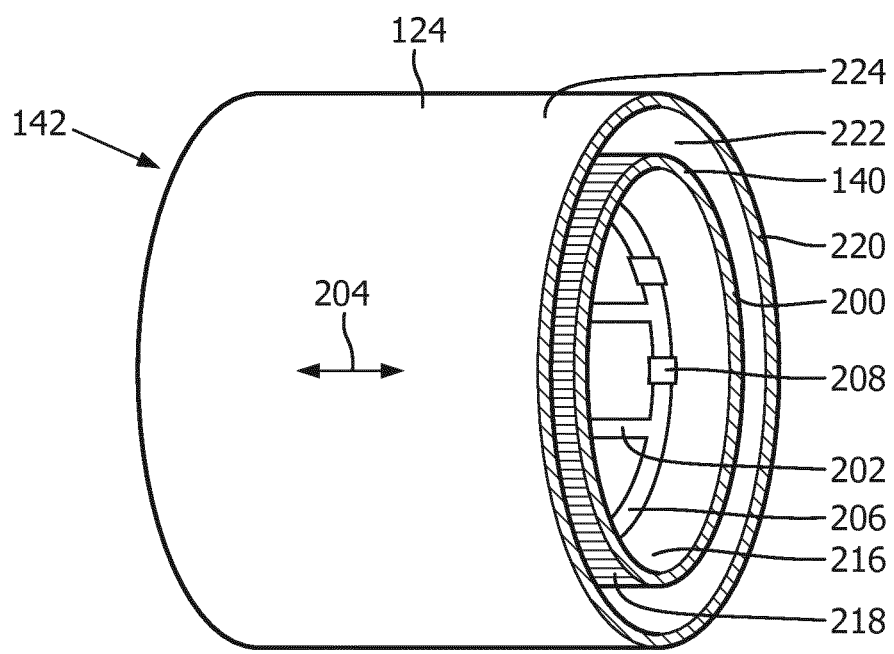
FIG. 2 is a perspective illustration of a radio frequency (RF) arrangement of the magnetic resonance (MR) imaging system of FIG. 1 comprising a RF coil and a RF shield according to a first, preferred embodiment.
Figure 3:
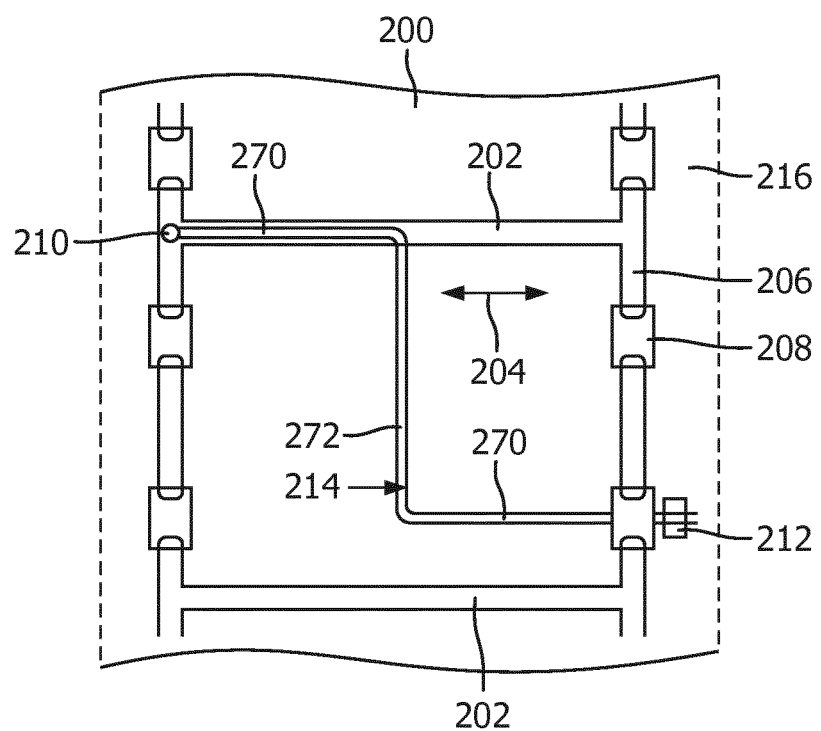
FIG. 3 is a schematic, planar illustration of a RF coil according to the first, embodiment with a co-planar feeding line.

A RF arrangement 142 according to a first, preferred embodiment of the invention can be seen in FIGS. 2 and 3. The RF arrangement 142 comprises the RF shield 124 and the RF coil 140, which are in this embodiment provided as two individual parts.

As can be seen in detail with respect to FIG. 2, the RF coil 140 comprises a coil PCB 200, multiple conductive rungs 202, which are provided on the coil PCB 200 and extending in an axis of the longitudinal direction 204 of the RF coil 140, a conductive ring 206, provided at each end side of the RF coil 140. Conductive rungs 202 and conductive rings 206 serve as conductive elements. The RF coil 140 further comprises coupling capacitors 208, which are provided along the conductive rungs 202 and the conductive rings 206. As can be seen under additional consideration of FIG. 3, the RF coil 140 further comprises multiple feeding ports 210 for the excitation of the conductive elements 202, 206, and a connection port 212. The feeding ports 210 are connected to the connection port 212 via feeding lines 214, one of which is shown in FIG. 3. The RF coil 140 of the first embodiment is a system integrated body coil with four or eight port feeding. In an alternative embodiment, the RF coil 140 is integrated in a dedicated head insert gradient coil. The head insert gradient coil has preferably an inner diameter of 30 to 40 cm.

As can be further seen in FIG. 3, the co-planar feeding line 214 has two axial sections 270 extending in the longitudinal direction 204 of the RF coil 140. Furthermore, the co-planar feeding line 214 has a circumferential section 272 extending in a circumferential direction of the RF coil 140, whereby the circumferential section 272 is provided in a center region with respect to a longitudinal direction 204 of the RF coil 140.

According the first embodiment, the conductive rungs 202 and the conductive rings 206 are provided at an inner face 216 of the coil PCB 200. In an alternative embodiment, the coupling capacitors 208 are provided by capacitive coupling through the coil PCB 200. Accordingly, the coupling capacitors 208 are provided as distributed capacitors. In this alternative embodiment, the coil PCB 200 comprises an additional metallization on its outer face 218.

Figure 7:
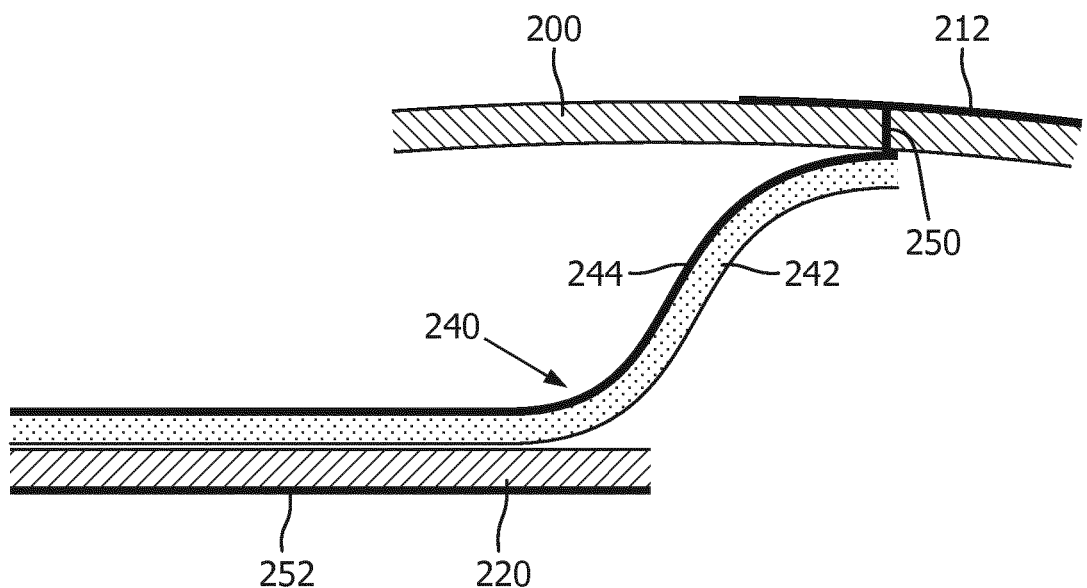
FIG. 7 is a sectional view of the coil PCB and the shield PCB, which are connected by a radial connection element, in accordance with a fifth embodiment.
Figure 8:
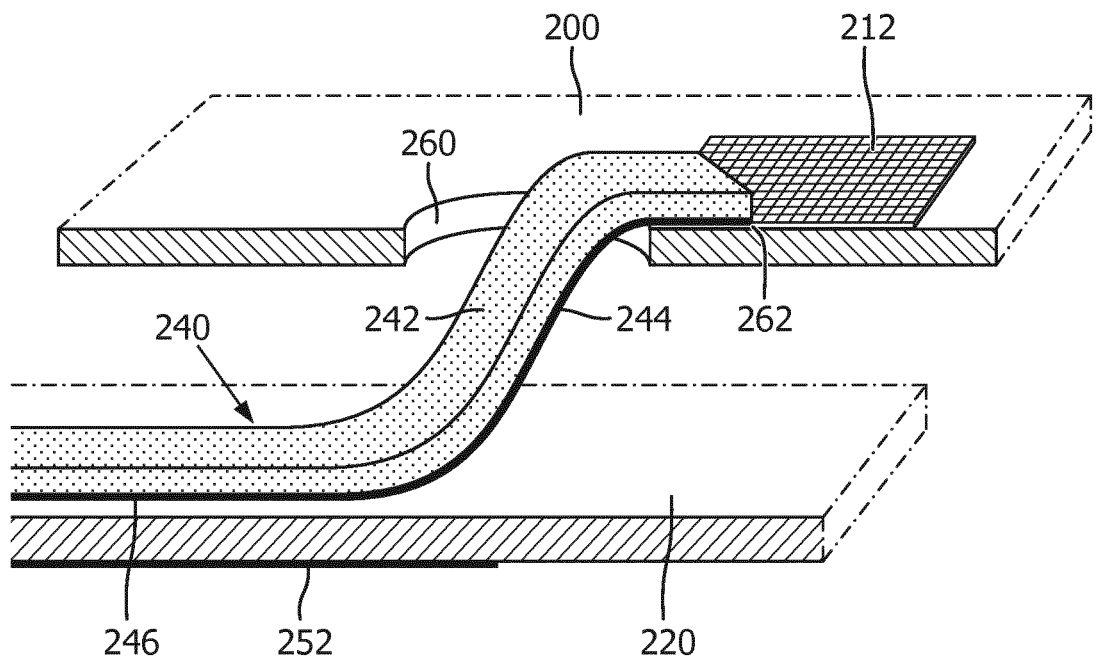
FIG. 8 is a sectional view of the coil PCB and the shield PCB, which are connected by a radial connection element extending through a hole in the coil PCB, in accordance with a sixth embodiment.

The RF shield 124 comprises a shield PCB 220, which has a patterned metallization on its inner face 222 and on its outer face 224, which form a metallic shield structure 252, as can be seen e.g. with respect to FIGS. 7 and 8. The metallizations provide overlapping areas creating distributed capacitors. The metallizations are provided as slitted structures, which do not allow low-frequency gradient eddy currents to circulate, but nevertheless to be transparent to RF frequencies of the MR imaging system 110.

Figure 4:
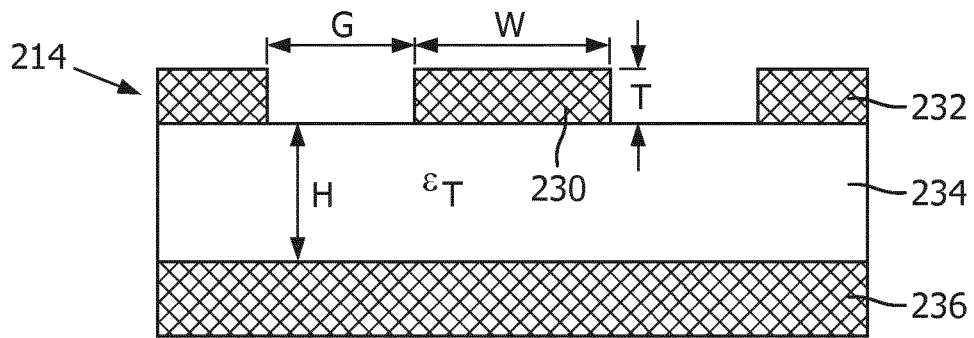
FIG. 4 is a sectional view of a co-planar feeding line, which is provided as a conductor-backed co-planar waveguide, in accordance with a second embodiment.

One of the co-planar feeding lines 214 of the RF coil 140 is shown separately in FIG. 4 with respect to a second embodiment. The co-planar feeding line 214 is provided in this embodiment as a conductor-backed co-planar waveguide (CBCPW). The co-planar feeding line 214 comprises a conducting track 230 having a width W and a pair of return conductors 232, which are provided one to either side of the conducting track 230. The conducting track 230 and the return conductors 232 are printed onto one side of a feeding line PCB 234 having a height H. The return conductors 232 are separated from the conducting track 230 by a small gap G, which has typically an unvarying width along the length of the feeding line 214.

The co-planar feeding line 214 further comprises a ground plane 236 covering an area corresponding at least to an area covered by the conducting track 230 and the return conductors 232. The ground plane 236 is provided on an opposite face of the feeding line PCB 234.

Figure 5:
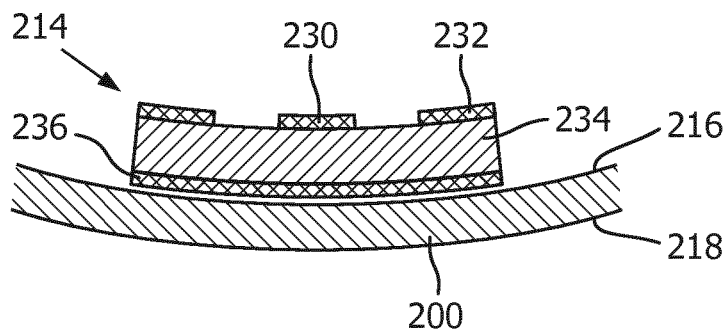
FIG. 5 is a sectional view of the co-planar feeding line of FIG. 4 provided at an inner surface of a coil PCB, in accordance with a third embodiment.

The feeding line 214 of the second embodiment is, according to a third embodiment, arranged at the inner face 216 of the coil PCB 200, as can be seen in FIG. 5. Hence, the ground plane 236 of the feeding line 214 is provided as a metallization on the coil PCB 200. The feeding line PCB 234 is arranged on the ground plane 236, and the conducting track 230 and the return conductors 232 are provided as metallizations on the feeding line PCB 234.

Figure 6:
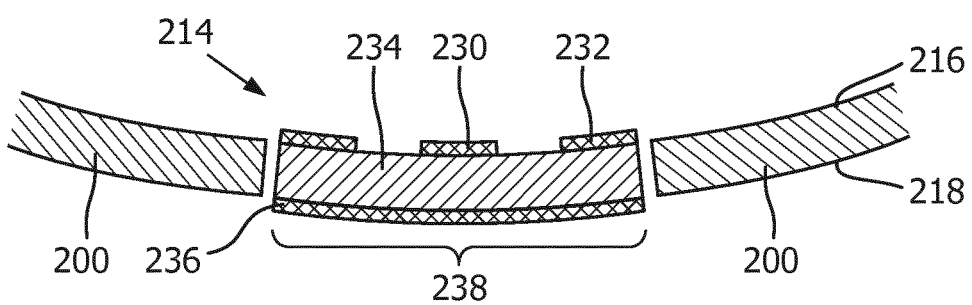
FIG. 6 is a sectional view of the co-planar feeding line of FIG. 4 provided in the coil PCB, in accordance with a fourth embodiment.

According to a fourth embodiment, which can be seen in FIG. 6, the coil PCB 200 is provided with a slot 238. The feeding line 214 of the second embodiment, realized with a co-planar conducting track 230 and return conductors 232 on feeding line PCB 234, is arranged entirely within the slot 238 of the coil PCB 200.

A fifth embodiment of the present invention can be seen in FIG. 7. A RF arrangement 142 of the fifth embodiment comprises a RF coil 140 and a RF shield 124, as discussed above. The RF shield 124 coaxially encompasses the RF coil 140. The RF arrangement 142 of the fifth embodiment is provided as a single part.

In the fifth embodiment, the shield PCB 220 comprises connection lines 246, which are connected e.g. by soldering to a coaxial cable (not shown). The coaxial cable serves as connection for the RF coil 140. The connection lines 246 are provided as co-planar connection lines 246, and which are arranged at the shield PCB 220, as can be seen e.g. in detail in FIG. 8. The detailed design of the connection lines 246 is as described above with respect to the feeding lines 214 of the different embodiments.

Furthermore, as can be seen in FIG. 7, a radial connection element 240 is provided, which extends between the shield PCB 220 and the coil PCB 200. The connection lines 246 are routed on the shield PCB to a location for connection to the coil PCB 200. The radial connection element 240 interconnects the connection lines 246 to the coil PCB 200. The radial connection element 240 is provided in a center region of the RF coil 140 with respect to its longitudinal direction 204. Hence, the connection port 212 of the RF coil 140 is provided in a center area of the RF coil 140 in respect to its longitudinal direction 204. The feeding lines 214 extend from the connection port 212 to the feeding ports 210 at both longitudinal ends of the RF coil 140.

The radial connection element 240 comprises a connection PCB 242 with a connection metallization 244 provided thereon, whereby the connection metallization 244 connects the connection lines 246 of the shield PCB 220 to the coil PCB 200. The connection PCB 242 is provided as a flexible PCB.

According to the fifth embodiment, the metallization 244 of the radial connection element 240 contacts the connection line 246 of the shield PCB 220 in an area not shown in FIG. 7. The metallization 244 of the radial connection element 240 contacts the connection port 212 of the coil PCB 200 via a coil contact element 250 extending radially through the coil PCB 200. The coil contact element 250 can be realized by conductive "vias".

A sixth embodiment of the present invention can be seen in FIG. 8. A RF arrangement 142 of the sixth embodiment comprises a RF coil 140 and a RF shield 124, as described above with respect to the fifth embodiment.

The RF arrangement 142 of the sixth embodiment differs from the RF arrangement 142 of the fifth embodiment merely in respect to the connection of the connection lines 246 to the connection port 212 via the radial connection element 240. However, the design of the radial connection element 240 of the sixth embodiment is identical to that of the radial connection element 240 of the fifth embodiment.

According to the sixth embodiment, the feeding lines 214 are provided at a radially inner face 216 of the coil PCB 200. Furthermore, the coil PCB 200 has a hole 260, and the radial connection element 240 extends through the hole 260 from the shield PCB 220 to the coil PCB 200. Hence, according to the sixth embodiment, the connection port 212 of the coil PCB 200 is directly contacted by the metallization 244 of the connection PCB 242 with a soldering connection 262.

In this embodiment, the metallization 244 of the radial connection element 240 directly converts into the connection line 246 of the shield PCB 220.

Figure 9:
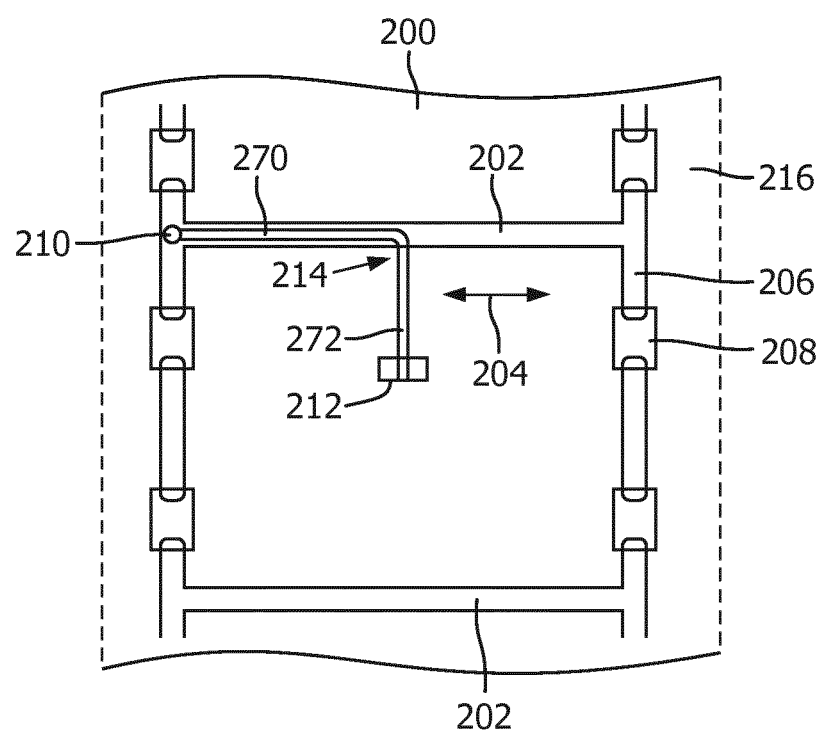
FIG. 9 is a schematic, planar illustration of a RF coil according to a seventh embodiment with a co-planar feeding line and a central connection port.

FIG. 9 is a schematic, planar illustration of a RF coil 140 according to a seventh embodiment with a co-planar feeding line 214 and a central connection port 212. As can be seen in detail in FIG. 9, the RF coil 140 of the seventh embodiment corresponds to the RF coil 140 of the second embodiment shown in FIG. 3. Hence, only differences between the RF coils 140 of the seventh and second embodiment will be discussed in detail.

RF coil 140 of the seventh embodiment comprises multiple feeding ports 210 for the excitation of the conductive elements 202, 206, and a connection port 212. The connection port 212 is arranged in a center region of the RF coil 140. The feeding ports 210 are connected to the connection port 212 via feeding lines 214, one of which is shown in FIG. 9.

As can be further seen in FIG. 9, the co-planar feeding line 214 has one axial section 270 extending in the longitudinal direction 204 of the RF coil 140. Furthermore, the co-planar feeding line 214 has a circumferential section 272 extending in a circumferential direction of the RF coil 140, whereby the circumferential section 272 is provided in a center region with respect to a longitudinal direction 204 of the RF coil 140 and connected to the connection port 212.

In accordance with the fifth and sixth embodiments, also in the seventh embodiment The RF shield 124 coaxially encompasses the RF coil 140. The RF shield 124 comprises a shield PCB 220, and in a way discussed previously with respect to the fifth and sixth embodiment, a connection line 246 is provided on the shield PCB 220. As described above with respect to the sixth and seventh embodiment, the connection line 246 is connected via radial connection element 240 to the connection port 212 and the feeding lines 214 of the coil PCB 200.

Figure 10:
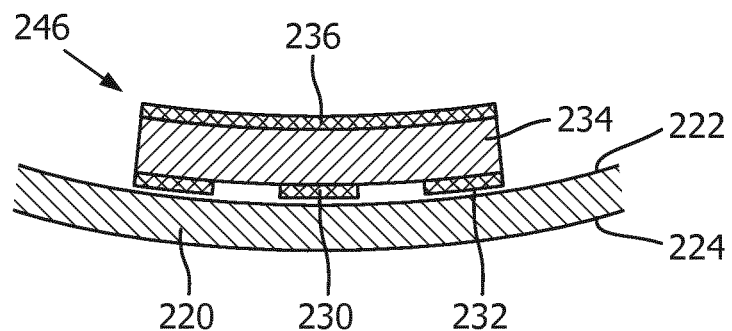
FIG. 10 is a sectional view of the co-planar feeding line of FIG. 4 provided at an inner surface of a shield PCB, in accordance with an eighth embodiment.
Figure 11:
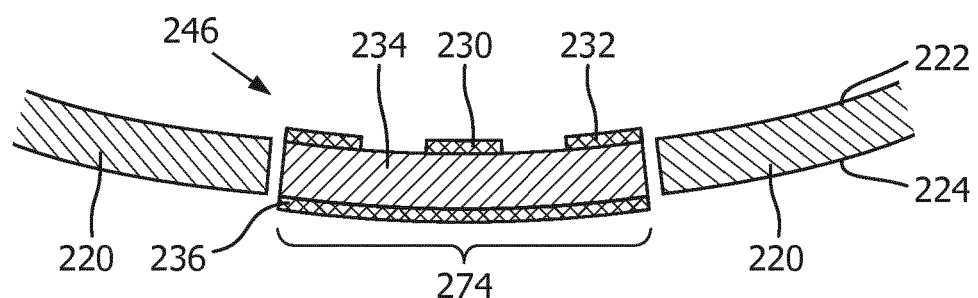
FIG. 11 is a sectional view of the co-planar feeding line of FIG. 4 provided in the shield PCB, in accordance with a ninth embodiment.

FIG. 10 shows a shield PCB 220 according to an eighth embodiment. Accordingly a connection line 246 is provided at the shield PCB 220. As can be seen in FIG. 10, the connection line 246 has in general the same setup as the feeding lines 214. However, according to the eighth embodiment, the connection line 246 is provided in this embodiment with its ground plane 236 facing away from the shield PCB 220. According to the eighth embodiment, the connection line 246 is provided with its conducting track 230 and its return conductors 232 on the shield PCB 220.

According to a ninth embodiment, the connection line 246 of the second embodiment is arranged in a slot 238 of the shield PCB 220. The co-planar connection line 246 of the ninth embodiment, is realized with a co-planar conducting track 230 and return conductors 232 on feeding line PCB 234, is arranged entirely within the slot 274 of the shield PCB 220.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 110 magnetic resonance (MR) imaging system
112 magnetic resonance (MR) scanner
114 main magnet
116 RF examination space 118 center axis
120 subject of interest
122 magnetic gradient coil system
124 radio frequency (RF) shield
126 MR imaging system control unit
128 monitor unit
130 MR image reconstruction unit
132 control line
134 RF transmitter unit
136 RF switching unit
138 control line
140 radio frequency (RF) coil
142 radio frequency (RF) arrangement
200 coil PCB
202 conductive rung, conductive element
204 longitudinal direction
206 conductive ring
208 coupling capacitors
210 feeding port
212 connection port
214 feeding line
216 inner face/metallisation (coil PCB)
218 outer face/metallisation (coil PCB)
220 shield PCB
222 inner face/metallisation (shield PCB)
224 outer face/metallisation (shield PCB)
230 conducting track, conductor
232 return conductor, conductor
234 feeding line PCB
236 ground plane
238 slot (coil PCB)
240 radial connection element
242 connection PCB
244 metallization (connection PCB)
246 connection line
250 coil contact element
252 metallic shield structure
260 hole
262 soldering connection
270 axial section
272 circumferential section
274 slot (shield PCB)
W width (conducting track)
H height (feeding line PCB)
G gap

The invention claimed is:

1. A radio frequency (RF) coil for use in a magnetic resonance (MR) imaging system (110), whereby the RF coil comprises
a coil printed circuit board (PCB),
multiple conductive elements provided on the coil PCB for applying a RF magnetic field to an examination space during RF transmit phases to excite nuclei of a subject of interest and to receive MR signals from the excited nuclei during RF receive phases,
one or multiple feeding ports for the excitation of the multiple conductive elements (202),
at least one connection port, and
one or multiple feeding lines connecting the at least one connection port (212) to the one or multiple feeding ports, whereby
the one or multiple feeding lines are provided as co-planar feeding lines, which are arranged at the coil PCB, whereby
the co-planar feeding lines are suitable to convey microwave-frequency signals and comprise a conducting track, which is printed onto a dielectric substrate (234), together with a pair of return conductors, which are provided one to either side of the conducting track, and all three conductors are provided co-planar on the same side of the substrate and the co-planar feeding lines are provided as conductor-backed co-planar waveguide (CBCPW) with a ground plane covering an area corresponding at least to an area covered by conductors of the co-planar feeding lines.

2. The radio frequency (RF) coil according to preceding claim 1, wherein
the co-planar feeding lines are provided as metallization on the coil PCB.

3. The radio frequency (RF) coil according to claim 1, wherein
the coil PCB is provided with at least one slot,
at least one feeding line PCB is provided in the at least one slot, and
at least one feeding line is provided on the at least one feeding line PCB.

4. The radio frequency (RF) coil according to claim 1, wherein
at least one of the co-planar feeding lines has an axial section extending in a longitudinal direction of the RF coil.

5. The radio frequency (RF) coil according to claim 1, wherein
at least one of the co-planar feeding lines has a circumferential section extending in a circumferential direction of the RF coil, whereby the circumferential section is provided in a center region with respect to a longitudinal direction of the RF coil.

6. The radio frequency (RF) coil according to claim 1, wherein
at least one of the co-planar feeding lines has an outer section extending on an outer side of the coil PCB, and an inner section extending on an inner side of the coil PCB,
whereby the coil PCB is provided with at least a coil contact element extending radially through the coil PCB, which electrically connects the outer section and the inner section.

7. A radio frequency (RF) arrangement for use in a magnetic resonance (MR) imaging system, comprising a RF coil according to claim 1 and a RF shield, whereby the RF shield coaxially encompasses the RF coil, the RF shield comprising
a shield PCB,
a metallic shield structure provided at the shield PCB, and
multiple connection lines connected to the at least one connection port, whereby the multiple connection lines are provided as co-planar connection lines, which are arranged at the shield PCB, and
at least one radial connection element which extends between the shield PCB and the coil PCB, and which electrically connects the multiple connection lines to the coil PCB for connection to the at least one connection port.

8. The radio frequency (RF) arrangement according to preceding claim 7, wherein
the at least one radial connection element is provided in a center region of the RF coil with respect to a longitudinal direction of the RF coil.

9. The radio frequency (RF) arrangement according to claim 7, wherein
the at least one radial connection element comprises a connection PCB with a connection metallization provided thereon, whereby the connection metallization connects the multiple connection lines to the at least one connection port of the coil PCB.

10. The radio frequency (RF) arrangement according to claim 7, wherein
the multiple connection lines are provided at a radially outer face of the shield PCB,
the shield PCB has at least one hole, and
the at least one radial connection element extends through the at least one hole from the shield PCB to the coil PCB.

11. The radio frequency (RF) arrangement according to claim 7, wherein
the one or multiple feeding lines are provided at a radially inner face of the coil PCB,
the coil PCB has at least one hole, and
the at least one radial connection element extends through the at least one hole from the shield PCB to the coil PCB.

12. The radio frequency (RF) arrangement according to claim 7, wherein
at least one of the connection lines has an outer section extending on an outer side of the shield PCB, and an inner section extending on an inner side of the shield PCB, whereby
the shield PCB is provided with at least a shield contact element extending radially through the shield PCB, which electrically connects the outer section and the inner section.

13. A magnetic resonance (MR) imaging system, comprising
a tubular examination space provided to position a subject of interest therein,
at least one radio frequency (RF) coil according to claim 1,
a RF screen for shielding the examination space,
a magnetic gradient coil system for generating gradient magnetic fields superimposed to a static magnetic field, and
a main magnet configured to generate the static magnetic field,
whereby the at least one RF coil, the RF screen, the magnetic gradient coil system and the main magnet are positioned in this order in a direction radially outward around the examination space.

14. A magnetic resonance (MR) imaging system, comprising
a tubular examination space provided to position a subject of interest therein,
a magnetic gradient coil system for generating gradient magnetic fields superimposed to a static magnetic field,
a main magnet configured to generate the static magnetic field, and
at least one radio frequency (RF) arrangement according to claim 7
whereby the at least one RF arrangement, the magnetic gradient coil system, and the main magnet are positioned in this order in a direction radially outward around the examination space.

\* \* \* \* \*